United States Patent
Geldhauser et al.

(10) Patent No.: US 12,258,658 B2
(45) Date of Patent: Mar. 25, 2025

(54) METHOD OF MANUFACTURING A LINEARLY VARIABLE OPTICAL FILTER

(71) Applicant: Optics Balzers AG, Balzers (LI)

(72) Inventors: Tobias Geldhauser, Wangs (CH); Petra Greussing, Meiningen (CH)

(73) Assignee: OPTICS BALZERS AG, Balzers (LI)

( * ) Notice: Subject to any disclaimer, the term of this patent is extended or adjusted under 35 U.S.C. 154(b) by 588 days.

(21) Appl. No.: 17/415,960

(22) PCT Filed: Nov. 22, 2019

(86) PCT No.: PCT/EP2019/025416
§ 371 (c)(1),
(2) Date: Jun. 18, 2021

(87) PCT Pub. No.: WO2020/126073
PCT Pub. Date: Jun. 25, 2020

(65) Prior Publication Data
US 2022/0074038 A1    Mar. 10, 2022

(30) Foreign Application Priority Data
Dec. 20, 2018    (DE) .................... 10 2018 133 062.6

(51) Int. Cl.
*C23C 14/04*    (2006.01)
*C23C 14/00*    (2006.01)
(Continued)

(52) U.S. Cl.
CPC ........ *C23C 14/042* (2013.01); *C23C 14/0021* (2013.01); *G01J 3/12* (2013.01); *G02B 5/285* (2013.01); *G01J 2003/1234* (2013.01)

(58) Field of Classification Search
CPC .................................................. C23C 14/044
See application file for complete search history.

(56) References Cited

U.S. PATENT DOCUMENTS

| 4,049,857 A | 9/1977 | Hammer |
|---|---|---|
| 6,091,196 A | 7/2000 | Codama |

(Continued)

FOREIGN PATENT DOCUMENTS

JP    H10183330 A    7/1998

OTHER PUBLICATIONS

Ji et al. "Linear variable filter enabling an enhanced wavelength gradient based on shadow-mask sputtering" (2017).*

(Continued)

*Primary Examiner* — Austin Murata
(74) *Attorney, Agent, or Firm* — Chrisman Gallo Tochtrop LLC (57) ABSTRACT

A method for producing a spectral gradient filter on a substrate including: providing the substrate with a first surface to be coated; providing a shadow mask that includes a bordered coating area with an edge, wherein the geometry of the shadow mask is adjusted to the desired gradient profile of the gradient filter; creating a masked substrate by fixing the shadow mask on the first substrate surface to be coated in such a way that parts of the substrate surface are covered, but the substrate surface is essentially exposed in the coating area; and carrying out PVD coating so that parts of the shadow mask lie directly on the surface of the substrate so that no vapour migration occurs in the area of these parts during the coating process and the shadow mask is detachably fixed to the substrate so that the shadow mask can be used for several coatings.

12 Claims, 5 Drawing Sheets

(51) Int. Cl.
      *G01J 3/12*          (2006.01)
      *G02B 5/28*          (2006.01)

(56) References Cited

U.S. PATENT DOCUMENTS

| | | | |
|---|---|---|---|
| 6,475,557 B1 * | 11/2002 | Mori | B29D 11/00634 |
| | | | 427/571 |
| 2005/0006223 A1 * | 1/2005 | Nichols | C23C 14/044 |
| | | | 204/192.1 |
| 2005/0098110 A1 | 5/2005 | Abiko | |
| 2008/0285165 A1 * | 11/2008 | Wu | G01J 3/02 |
| | | | 438/57 |
| 2012/0045588 A1 | 2/2012 | DeVito | |
| 2012/0099615 A1 * | 4/2012 | Sun | H10K 71/00 |
| | | | 430/5 |
| 2014/0147964 A1 | 5/2014 | Wu et al. | |
| 2014/0191201 A1 * | 7/2014 | Hamer | H10K 71/166 |
| | | | 118/721 |
| 2015/0259779 A1 | 9/2015 | Ma et al. | |
| 2016/0237547 A1 * | 8/2016 | Sprague | C23C 14/044 |

OTHER PUBLICATIONS

Peng Ji et al., "Linear Variable Filter Enabling an Enhanced Wavelength Gradient Based on Shadow-Mask Sputtering", Microwave and Optical Technology Letters, US, vol. 59, No. 12, Sep. 22, 2017, pp. 3142-3146.
International Search Report for PCT/EP2019/025416 dated Jul. 7, 2020.
Written Opinion for PCT/EP2019/025416 dated Jul. 7, 2020.

\* cited by examiner

-------- Ideal linear profile from 0 to 2000 μm

| Nb2O5 | 72.12 |
| --- | --- |
| SiO2 | 84.28 |
| Nb2O5 | 70.71 |
| SiO2 | 58.99 |
| Nb2O5 | 72.99 |
| SiO2 | 65.28 |
| Nb2O5 | 64.22 |
| SiO2 | 87.28 |
| Nb2O5 | 52.14 |
| SiO2 | 98.29 |
| Nb2O5 | 49.11 |
| SiO2 | 92.48 |
| Nb2O5 | 58.86 |
| SiO2 | 75.24 |
| Nb2O5 | 65.88 |
| SiO2 | 70.75 |
| Nb2O5 | 62.17 |
| SiO2 | 88.28 |
| Nb2O5 | 52.26 |
| SiO2 | 101.71 |
| Nb2O5 | 46.65 |
| SiO2 | 105.26 |
| Nb2O5 | 51.11 |
| SiO2 | 105.37 |
| Nb2O5 | 55.65 |
| SiO2 | 52.71 |

METHOD OF MANUFACTURING A LINEARLY VARIABLE OPTICAL FILTER

The present invention relates to a gradient filter. In particular, the present invention relates to the manufacture of a linearly variable short pass filter, long pass filter and/or band pass filter.

Linear variable filters are optical elements whose spectral properties change laterally on a substrate at least approximately and preferably as largely linearly as possible.

Spectral properties essentially mean the reflection and transmission characteristics as a function of the wavelength of the electromagnetic radiation—when the same is applied to the surface of the substrate.

A property that changes laterally on the substrate means that the property changes when a transition is made from a first area on the surface of the substrate to a second area of the surface that is shifted laterally to the first.

Such a change is linear, if the extent of the change in the property is proportional to the lateral displacement.

The optical element can be, for example, a long pass, a short pass or a bandpass. A change in the spectral property then means, for example, the displacement of the edges of the long pass, short pass or band pass.

Long and short passes are often implemented using dielectric alternating layer systems. Bandpass filters are often implemented as dielectric thin film Fabry Perot filters from alternating layer systems made of a low and a high refractive index material, which systems have a reflective effect, and one or more spacer layers. If the layer thickness of all layers including the spacer layer(s) or only the spacer layer(s) of a bandpass increases continuously and laterally above the substrate, the central wavelength of the passband also changes continuously, as it depends on the respective layer thicknesses. In the following, the layers of the alternating layer systems are also referred to as mirror layers.

There are different known approaches to achieve such a change in layer thickness. For example, it can be taken advantage of the geometric conditions of the coating system used for coating. For this purpose, it is possible to place the substrate clearly offset to the side and at a relatively short distance from a vapor deposition source. This geometry creates a large gradient on the substrate. However, such a process can hardly be implemented economically and industrially, since the properties of the coating are too sensitive to details of the geometry.

According to another procedure for producing a corresponding variable bandpass filter, the dielectric mirror layers are applied homogeneously and only the spacer layer is implemented with a variable thickness. In order to achieve this, the spacer layer can, for example, be coated laterally in an inhomogeneous manner with a photoresist and then etched off. As a result, the part of the spacer layer removed in the area with thin photoresist is bigger than that in the area with thick photoresist. According to a variant of the method just described, the spacer layer is removed directly in an inhomogeneous manner, i.e. without photoresist, but with the aid of a mask that ensures laterally different etching rates. Both process variants are, however, very complex and therefore also hardly feasible from the economical point of view.

In order to achieve a lateral change in layer thickness, in particular also of the mirror layers, it is known to use shadow masks. The shadow mask is placed between the substrate and the coating source. Due to the shadowing effects of the shadow mask, different coating rates occur laterally on the substrate to be coated, which coating rates, if successful, then lead to the desired lateral thickness gradient. On the one hand there are methods in which the shadow mask is moved relative to the substrate during the coating, on the other hand there are methods in which the shadow mask is kept fixed relative to the substrate. Movable components in a vacuum coating are complex and cause a great deal of effort and low system utilization, so that this method does not allow an inexpensive production. In the embodiment of the shadow mask which is kept fixed relative to the substrate and its positioning, a fundamental distinction must be made between two different approaches.

Figure 1:
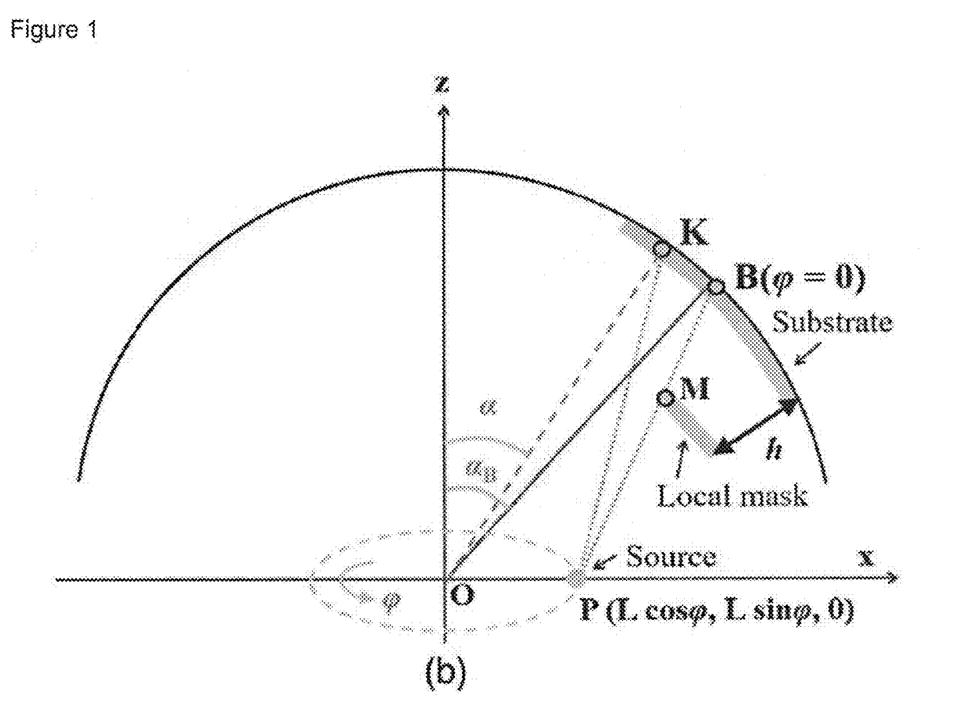
FIG. 1 shows schematically a coating system with a spaced shadow mask according to the prior art.

According to a first approach, the shadow mask is arranged at a fixed distance h from the substrate, between the substrate and the coating source. FIG. 1 (from Cheng-Hao Ko et al, SPIE/COS Photonics Asia Conference Paper July 2017 DOI: 10.1109/CLEOPR.2017.8118600; https://www.researchgate.net/publication/3214130 08;) shows the corresponding arrangement, wherein it is an evaporation system with a rotating dome to hold the substrates with mask. In this figure, the point-like coating source is shown as a source moving on a circular path around the z-axis, while the substrate and shadow mask are fixed. In the implementation, the coating source will be stationary and the dome shown as a segment of a circle, on which the substrate and spaced shadow mask are fixed, will rotate. The viewer in FIG. 1 is therefore in the reference system rotating with the dome. A plurality of coating sources are usually installed eccentrically for the various materials.

With this approach placing the shadow mask at a distance from the substrate, the (desired) vapour migration occurs in the shadow area of the mask on the substrate with a correspondingly lower but existing coating rate, whereas the coating rate increases with increasing distance from the shadow area of the mask up to the rate that would be reached without a shadow mask. A coating gradient is thus created in and around the shadow area of the mask. Ko et al simulate this gradient and try to achieve the desired gradient by adjusting the distance h.

A disadvantage of the method used by Ko et al, however, is that the effect of the shadow mask depends directly and strongly on the geometry of the coating system and in particular on the radius at which the substrates are mounted on the dome. If the radius changes, the shadow mask and its corresponding distance h from the substrate must be determined again in complex tests in combination with simulations. During the rotation of the dome around the eccentric point source, the shadowing effect also changes, so that the control of the coating geometry is very complex. In addition, the variation of the distance h only provides a degree of freedom for optimizing the coating gradient. This is often not sufficient to achieve the desired steepness of the gradient and its linearity.

According to a second approach, as disclosed for example in WO2016171978A1 by James D. Lane, a shadow mask is printed directly onto the substrate to be coated via a structured sacrificial layer. This is preferably done by means of 3D printing and the profiling of this mask is particularly preferably optimized by using spatial algorithms. The results achieved with this method are satisfactory, provided that the corresponding sophisticated simulation software is available.

However, this is a «single-use shadow mask», i.e. it cannot be reused. The costs for each new application of the structured sacrificial layer and the 3D-printed mask as well as the removal step are not acceptable for many of the applications that are of interest here.

In view of this prior art, the present invention is accordingly based on the following task: The object of the invention is to enable the production of linearly variable bandpass filters, with the challenge that the central wavelength of the bandpass filter above the substrate has at least approximately and preferably within the scope of the manufacturing tolerances a course that is more or less, and ideally, precise and linearly lateral.

In the course of the miniaturization of optical components, for example for mobile applications, a further essential challenge is to implement the linearly variable filter on a very small area with a large change in the wavelength at a short distance. This means that steep and linear gradients have to be realized.

Another challenge for such applications is to provide a cost-effective manufacturing method with as few working steps as possible, and ideally only one working step, and a large number of components.

It is possible to implement simple geometries in sputtering systems of various designs. For example, a sputtering system with a drum design has this simple geometry which allows a simple implementation of the production of linearly variable filters with a fixed shadow mask. The coating material is sputtered from an elongated sputtering source. The substrates are fixed on the shell of a drum, the drum rotates during the coating so that the substrates run past the sputtering source or sources, see for example US20050006223A1 for a schematic representation of the system geometry. The axis of rotation of the drum is parallel to a straight line lying in the target surface and the substrates are mounted on the drum shell in such a way that the plane of the substrates spanned by the substrate surface does not intersect the axis of rotation of the drum. During the coating process the substrates thus run past the sputtering source or sources transversely to the straight line. This means that for sufficiently elongated sputtering sources whose longitudinal extent is oriented towards the above-mentioned straight line, the coating geometry is identical for each substrate and for each height, so that all substrates are coated at each height under the same conditions.

In other embodiments of sputtering systems, so-called inline systems, the substrates are moved linearly and also transversely to the longitudinal axis past one or more sputtering sources. This corresponds to the (theoretical) case of a drum with an infinitely large radius, so the coating geometry is very similar to the geometry in a drum system.

Another possibility for a system structure in which the substrates are also moved past sputtering sources essentially transversely to the longitudinal axis is to use systems with a round turntable, wherein the sputtering source or sources are installed in the vicinity of the outer radius of the turntable, but spaced apart from it, and the substrates are mounted on the turntable near the outer radius of the turntable. As a result of the rotation of the turntable the substrates are moved past the sputtering sources, see for example WO2016156496A1.

All these types of systems, in which the substrates are transported essentially transversely to the longitudinal axis of sputtering sources and in which the plane spanned by the surface of the substrates is oriented parallel to the sputtering surface in at least one point of its movement, are particularly well suited for the production of linearly variable filters according to the invention.

The object outlined above is achieved according to the present invention as follows: In order to obtain the continuous change in layer thickness, a shadow mask is used. The latter lies at least in part directly on the substrate and moves with the substrate in the coating system. This lying position on the substrate is a mechanically releasable lying position. For example, clamps can be used to place the substrate and the shadow mask on top of one another. However, another holder can also be used, in which both the shadow mask and the substrate are clamped, lying on top of one another.

The shape and thickness and edge profile of the shadow mask are selected in such a way that the desired linearity of the coating thickness on the substrate occurs at least approximately. To achieve this, the thickness of the shadow mask, but also the edge profile of the shadow mask, can be adjusted.

The bandpass is then coated. In the following, the expression "bandpass" is used, but the explanations also apply in an analogous manner to other optical filter types. In and around the shadowing area of the shadow mask, the coating rate will decrease because of the shadowing, which leads to the bandpass being shifted to shorter wavelengths in this area. If the original, non-shifted bandpass is to be implemented in the area of the shadowing, the coating process must be longer, which means that the bandpass is shifted to longer wavelengths in the area that is not shadowed.

Since the shadow mask lies on the substrate and therefore rotates with the substrate, all individual mirror and spacer layers have the same layer thickness profile on the substrate.

Each substrate is provided with its own shadow mask, wherein the respective shadow mask can be the same for all substrates. With this arrangement, many substrates can be coated simultaneously and inexpensively. The utilization of the system is therefore almost the same as for homogeneous coatings.

In a coating campaign, however, the shadow masks on the respective substrates can be different in terms of geometry, such as thickness and edge profile. This can be advantageous for optimization purposes, for example, if the optimal thickness and/or profile of the shadow mask is/are to be found in order to achieve a specific gradient.

On the other hand, this can also be advantageous, if the customer wants different gradients and the respective required number of substrates does not completely fill the coating system with a certain gradient.

Ultimately, different shadow masks within a coating campaign can be advantageous, if the customer specifications are so narrow that, due to the manufacturing tolerances, it cannot be guaranteed to meet the customer specifications with a certain shadow mask. The coating with different shadow masks then allows the sorting out and selection of those coated substrates that meet the customer's specifications.

With the configuration described above, complex bandpass filters with a narrow full width at half maximum and steep edges which, for example, have more than one spacer layer, can be produced.

Another essential aspect of the present invention is that the shadow masks can be used several times, if necessary after cleaning. In particular, no structured sacrificial layer is necessary on the substrate. This means that, compared to coating without a shadow mask, no additional production steps are necessary.

As described above, the shadow mask according to the invention lies at least in part on the substrate. However, this also includes the case that a shadow mask lies entirely on the substrate and only coating areas of the substrate are exposed.

As described above, the shadow mask according to the invention which has the thickness of this reusable mask lying on it and its edge profile framing the coating areas provides two degrees of freedom for optimization.

Figure 4:
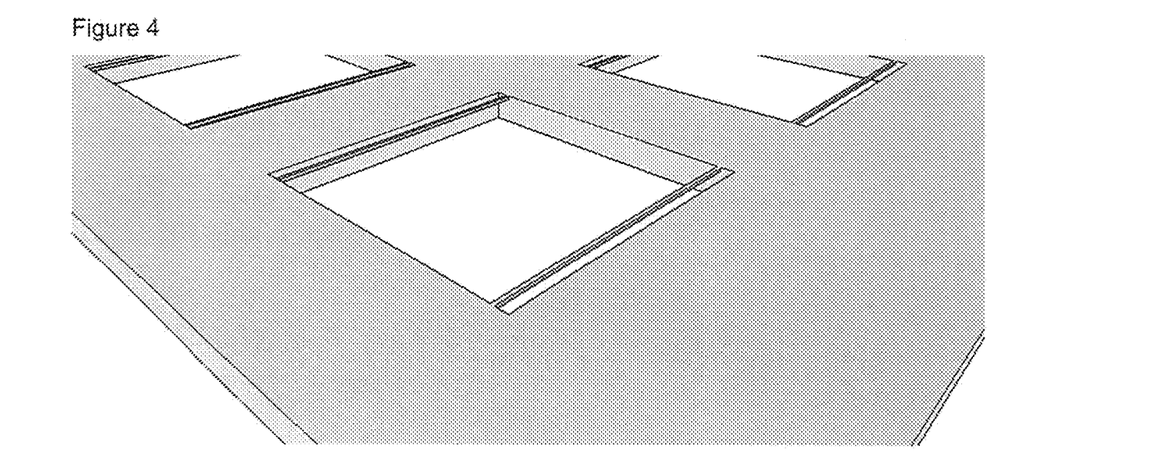
FIG. 4 shows part of a modified shadow mask.
Figure 5:
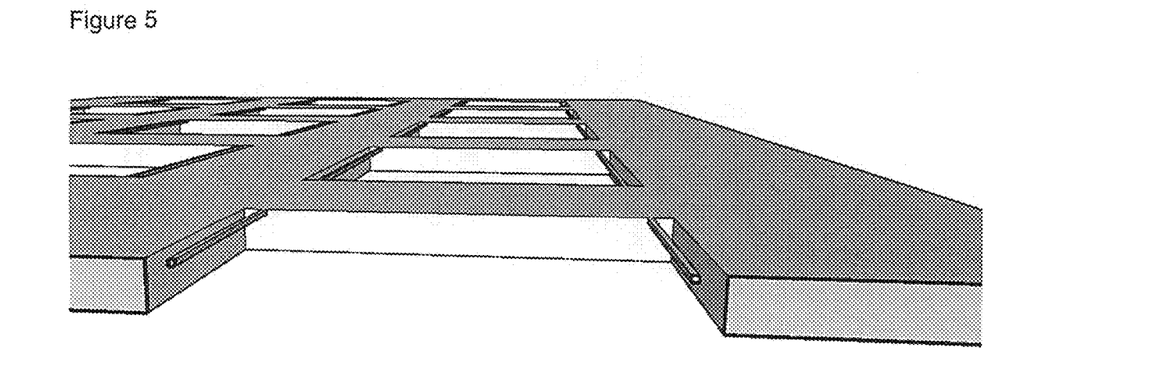
FIG. 5 shows a section of a part of the shadow mask of FIG. 4.

According to a preferred embodiment, however, additional elements spaced apart from the substrate can be applied in the coating area of the shadow mask. This can be realized, for example, in the form of thin webs, which ensure more or less locally a local reduction of the coating rate, leading to a fine-tuning of the lateral coating rates and in this way, for example, to a better approximation of the linearity. A shadow mask modified in this way is partially shown in FIG. 4. FIG. 5 shows the section through a corresponding shadow mask.

The invention will now be explained in detail by means of examples and with the aid of the figures.

FIG. 1 shows schematically a coating system with a spaced shadow mask according to the prior art.

According to a first exemplary embodiment of the present invention, various shadow masks were tested. On the one hand, the thickness of the masks was varied from 1 mm to 5 mm. On the other hand, the opening of the various coating fields was provided with a vertical edge or with different beveled edges. It was practically determined by means of 3 different coating procedures how the different mask forms affect the course of the layer thickness. The size of the coating openings at 20×20 mm is not optimized for maximum use of the surface, but in such a way that even with the 4 to 5 mm thick masks there are no undesirable shadowing effects from the opposite side.

Figure 2:
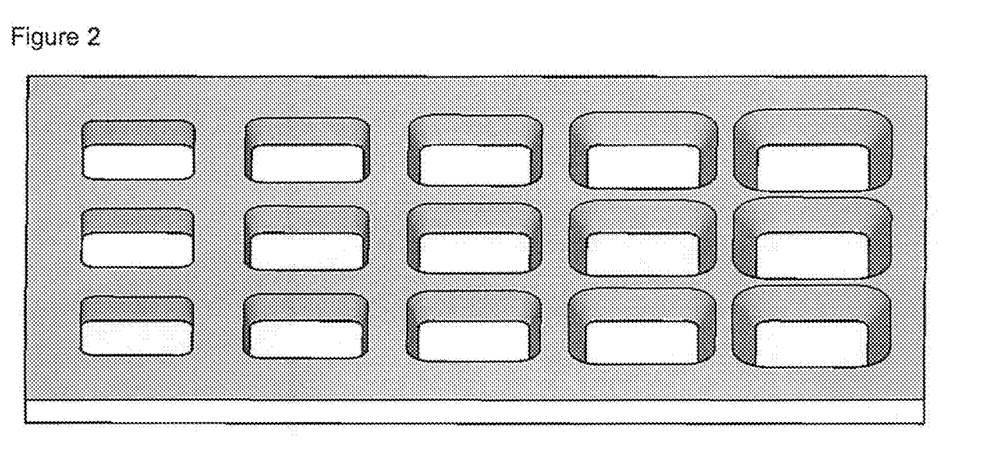
FIG. 2 shows a shadow mask with 15 coating openings.
Figure 3:
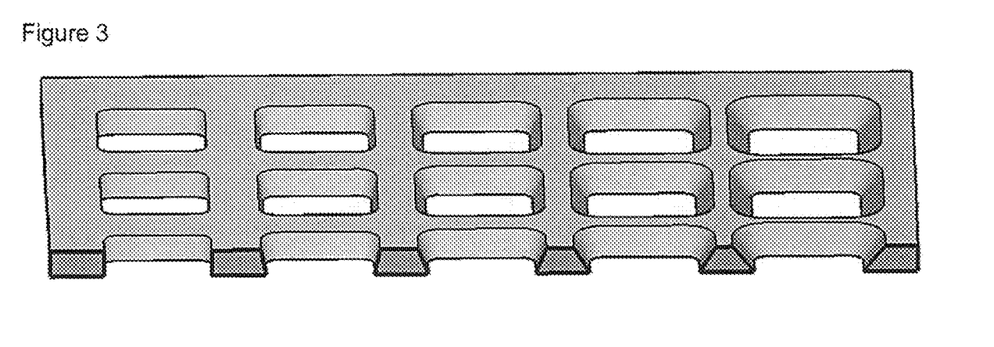
FIG. 3 shows a section through the shadow mask of FIG. 2.

FIG. 2 shows a corresponding 5 mm thick shadow mask with 15 coating openings. The 3 openings on the left side have a vertical edge. In a column to the right of it, a wedge of 1 mm width has been realized, wherein the coating opening itself remains the same. The width of the wedge then increases by one millimeter per column, so that wedges with a width of 4 mm are implemented in the rightmost column. For clarification, FIG. 3 shows a section through the shadow mask of FIG. 2.

Simulations have shown that the thicker the masks, the smaller the increase in layer thickness over the distance, although the distance over which the wavelength profile is approximately linear becomes greater. In addition, the simulations showed that the larger the bevel of the mask, the smaller the increase in layer thickness over the distance.

It is therefore clear that with the two parameters, 1) thickness of the mask and 2) edge steepness of the coating openings, two degrees of freedom are available that make it possible to generate masks that lead to coating gradients that come as close as possible to customer specifications.

Figure 6:
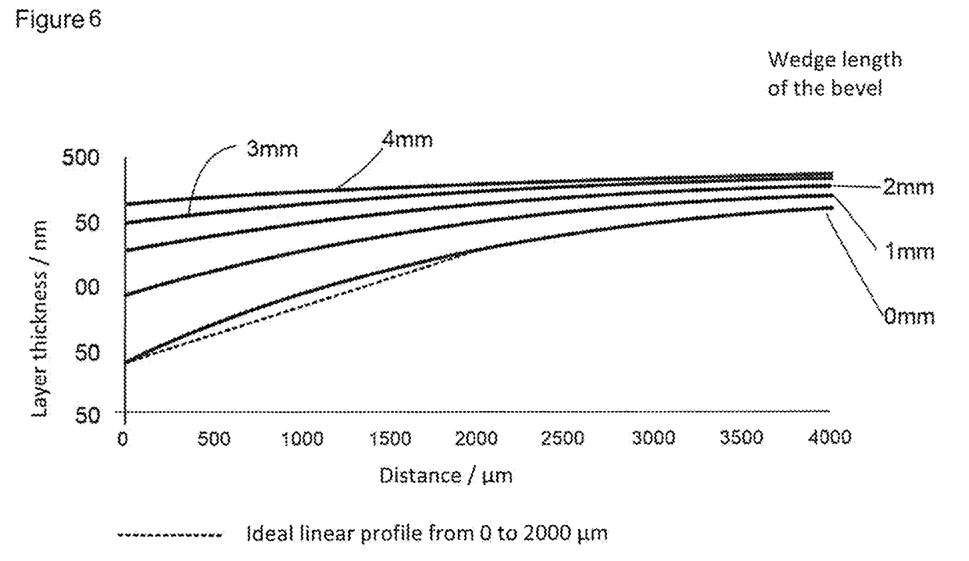
FIG. 6 shows the simulated increase in thickness with the distance from the edge of the coating area.

For a shadow mask with a thickness of 2 mm, FIG. 6 shows the simulated increase in thickness with the distance from the edge of the coating area, specifically for different wedges. "0 mm" is a vertical edge. "1 mm" is a wedge having a width of one millimeter, and so on. It can clearly be seen that the greatest layer thickness gradient can be achieved with a vertical edge. Following this, the dashed line shows an ideally linear course of the increase in layer thickness over a distance of 2 mm.

Figure 7:
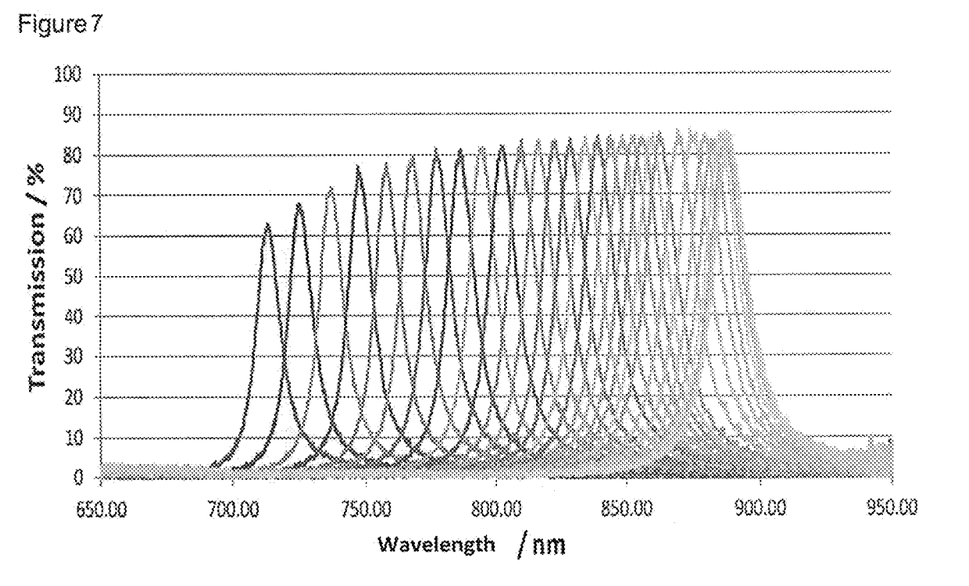
FIG. 7 shows the shift of the transmission peak.

In the case of a bandpass produced with a shadow mask having a thickness of 5 mm without a wedge, based on the Fabry-Perot design, the shift of the transmission peak is shown in FIG. 7. The measured transmission curves are shown, with neighboring curves each resulting from a lateral displacement of the substrate by 0.2 mm. As expected, the linearity is only approximated in both cases (FIG. 6 and also FIG. 7). The gradient is larger at the edge of the coating area, whereas the gradient is still present towards the center of the coating area, but is somewhat lower.

For many applications, this approximation to linearity is sufficient. If this is not the case, however, the shadow mask can be adjusted with thin webs arranged in the coating area in accordance with the masks shown in FIGS. 4 and 5. With reference to FIG. 6, for example, a thin web with a width of only 0.25 mm and a depth of 0.2 mm could be arranged at the location marked with a 1 mm distance.

Figure 8:
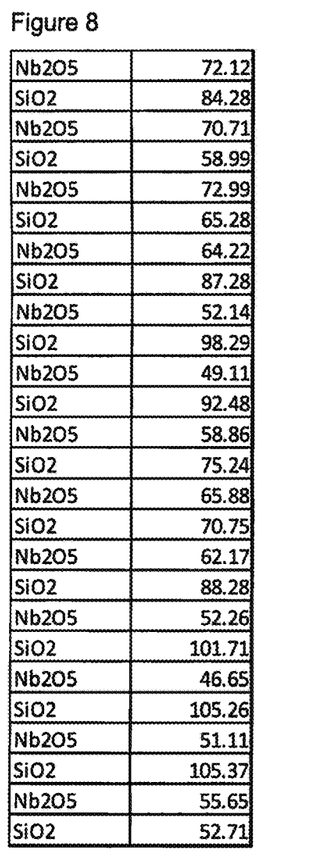
FIG. 8 shows the layer thicknesses of the filter from a layer system.
Figure 9:
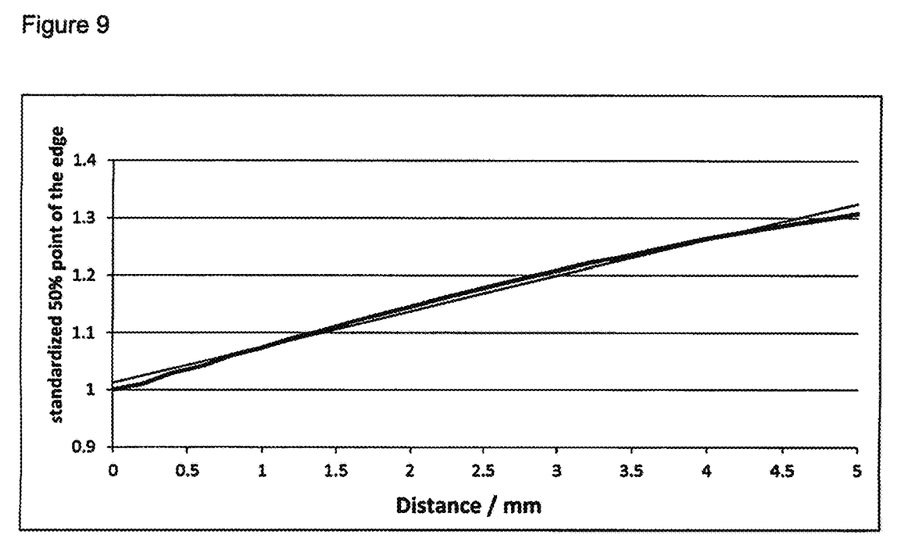
FIG. 9 shows a layer thickness profile.
Figure 10:
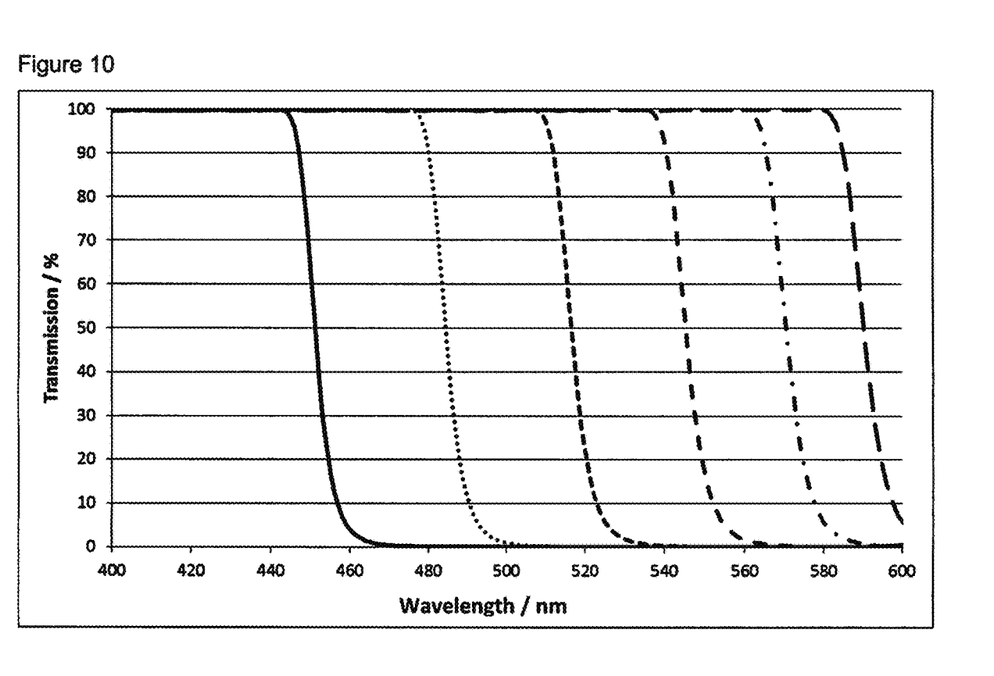
FIG. 10 shows spectral properties at various positions on the substrate.

In a further example, the invention is explained for a short-pass filter. FIG. 8 shows the layer thicknesses of the filter from a layer system of $SiO_2$ and $Nb_2O_5$ as low and high refractive index materials. The layer thicknesses are given in nanometers and the first layer on the substrate is listed in the first line of the table. These specified layer thicknesses apply immediately next to the shadow mask. The shadow mask has a thickness of 5 mm, so that over a distance of 5 mm on the substrate, calculated from the edge of the shadow mask, the shadow mask produces the layer thickness profile shown in FIG. 9 and normalized to the layer thicknesses directly next to the shadow mask. The spectral properties at various positions on the substrate, at a distance of 1 mm from one another from a position directly next to the shadow mask (solid line) up to 5 mm from the edge of the shadow mask (dashed lines), are shown in FIG. 10. In this case, too, the spectral position of the edge changes continuously, almost linearly and within a small area on the substrate.

Figure 11:
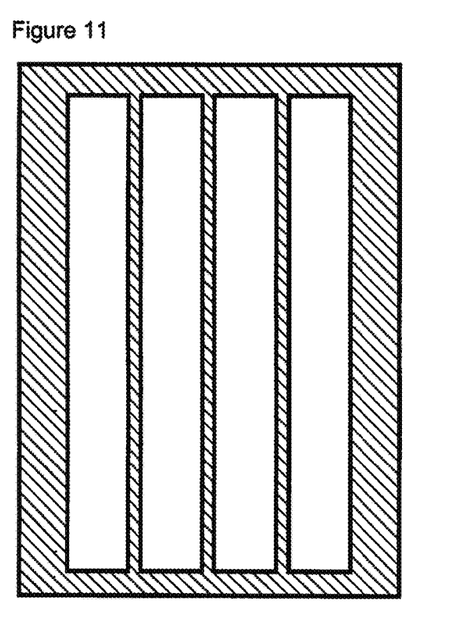
FIG. 11 shows a shadow mask optimized for system utilization.

An essential aspect of the present invention is that very good system utilization can be achieved and that it is possible to produce filters with identical properties. FIG. 11 shows a shadow mask optimized for system utilization. A plan substrate with dimensions of 110 mm×160 mm is covered with a shadow mask of the same external dimensions. For the specific geometry of the required filter (5 mm×5 mm outer dimensions with a linearly variable filter area in the center of 2 mm×2 mm), the shadow mask can be covered with 4 open areas that extend almost over the entire height of the substrate. A variable filter area is created on each side of each opening so that 8 rows of filters are produced on the substrate. There is space for 30 filters in each row, so that 240 filters can be produced on each substrate, which filters can be obtained by separating them from the large substrate after the coating process. Before the separation, further coatings, such as an anti-reflective coating, can be applied to the back of the substrate.

So far, only shadow masks with vertical edges or with a wedge have been shown in the figures. In addition, shadow masks with overhanging edges, i.e. edges with a recess, can be interesting.

So far, only those gradients have been considered whose gradient property is due to only one edge of the shadow mask, i.e. an increase in layer thickness with a distance increasing perpendicular to this edge.

If two edges that are at an angle to one another influence the change in layer thickness with increasing distance from these edges, as is the case, for example, in the corners of the shadow masks shown in FIGS. 2 to 5, then the layer thickness will depend on two coordinates on the substrate. One could speak of a two-dimensional gradient here. The present invention also relates to such two-dimensional gradient filters and their manufacture.

A method has been disclosed for producing a spectral gradient filter on a substrate, comprising the steps of:
 providing the substrate with a first surface to be coated
 providing a shadow mask that comprises at least one bordered coating area with an edge, wherein the geometry of the shadow mask is adjusted to the desired gradient profile of the gradient filter
 creating a masked substrate by fixing the shadow mask on the first substrate surface to be coated, in such a way that parts of the substrate surface are covered, but the substrate surface is essentially exposed in the coating area,
 inserting the masked substrate into a coating system based on physical deposition from the gas phase (PVD)
 carrying out the PVD coating
 characterized in that
 at least parts of the shadow mask lie directly on the surface of the substrate so that no vapour migration occurs in the area of these parts during the coating and wherein the shadow mask is fixed to the substrate in a mechanically detachable manner so that the shadow mask can be used for several coatings.

In the process, the edge of the shadow mask can be designed to be vertical or wedge-shaped or overhanging.

The shadow mask can comprise several coating areas.

To provide the shadow mask, test coatings can be carried out with test shadow masks of different thicknesses and/or different degrees of edge steepness, wherein the test shadow masks can comprise several coating areas with different degrees of edge steepness.

The shadow mask can have at least one element spaced apart from the edge in the coating area, wherein the element is also spaced from the substrate, when the shadow mask together with the substrate form the masked substrate.

The at least one element can be designed in the form of a web.

The coating system can be a drum system, in which the substrates to be coated are guided past a coating source with a target surface, preferably a sputtering target, wherein the axis of rotation of the drum is arranged parallel to a straight line lying in the target surface and the substrates are mounted on the drum shell in such a way that the plane of the substrates spanned by the substrate surface does not intersect the axis of rotation of the drum.

The coating system can also be a system with a turntable, in which the substrates to be coated are guided past a coating source with a target surface, preferably a sputtering target, wherein the axis of rotation of the turntable is perpendicular to the target surface and the substrate surface to be coated is aligned parallel to the target surface at least during the coating.

Furthermore, the coating system can be, for example, a linear system, in which the substrates to be coated are guided linearly past a coating source with a target surface, preferably a sputtering target, and at least during the coating process the substrate surface is parallel to the surface formed by the coating source.

A shadow mask with a shadowing area and a coating area has been disclosed, wherein the shadowing area and the coating area are separated by an edge, wherein at least one element spaced apart from the edge is provided in the coating area. The at least one element spaced apart from the edge can have a depth which does not exceed half the thickness of the shadow mask. The at least one element spaced apart from the edge can be positively connected to one side of the shadow mask.

What is claimed is:

1. Method for producing a spectral gradient filter on a substrate comprising the steps of:
 providing the substrate with a first surface to be coated
 providing a shadow mask that comprises at least one opening surrounded by an edge, wherein the geometry of the shadow mask is adjusted to a desired gradient profile of the gradient filter
 creating a masked substrate by fixing the shadow mask on the first substrate surface to be coated in such a way that parts of the first substrate surface are covered, but the first substrate surface is exposed in the coating area,
 inserting the masked substrate into a coating system which is based on physical deposition from the gas phase (PVD), and
 carrying out the PVD coating,
 wherein
 at least parts of the shadow mask lie directly on the surface of the substrate so that no vapour migration occurs in an area of these parts during the coating and wherein the shadow mask is fixed to the substrate in a mechanically detachable manner so that the shadow mask can be used for several coatings.

2. The method according to claim 1, wherein the edge of the shadow mask is designed to be vertical or wedge-shaped or overhanging.

3. The method according to claim 1, wherein the shadow mask comprises several coating areas.

4. The method according to claim 1, wherein for providing the shadow mask, test coatings are carried out with test shadow masks of different thicknesses and/or different degrees of edge steepness, wherein the test shadow masks can comprise several coating areas with different degrees of edge steepness.

5. The method according to claim 1, wherein the shadow mask has at least one element spaced apart from the edge in the coating area, wherein the element is also spaced from the substrate, when the shadow mask together with the substrate form the masked substrate.

6. The method according to claim 5, wherein the at least one element is designed in the form of a web.

7. The method according to claim 1, wherein the coating system is a system with a turntable, in which the substrates to be coated are guided past a coating source with a target surface, wherein the axis of rotation of the turntable is perpendicular to the target surface and the substrate surface to be coated is aligned parallel to the target surface at least during the coating process.

8. The method according to claim 1, wherein the coating system is a linear system, in which the substrates to be coated are linearly guided past a coating source with a target surface, and the substrate surface is parallel to the surface formed by the coating source at least during the coating process.

9. A method for producing a spectral gradient filter on a substrate comprising the steps of:
 providing the substrate with a first surface to be coated
 providing a shadow mask that comprises at least one bordered coating area with an edge, wherein the geometry of the shadow mask is adjusted to a desired gradient profile of the gradient filter creating a masked substrate by fixing the shadow mask on the first substrate surface to be coated in such a way that parts of the first substrate surface are covered, but the first substrate surface is exposed in the coating area, inserting the masked substrate into a coating system which is based on physical deposition from the gas phase (PVD), and carrying out the PVD coating, wherein at least parts of the shadow mask lie directly on the surface of the substrate so that no vapour migration occurs in an area of these parts during the coating and wherein the shadow mask is fixed to the substrate in a mechanically detachable manner so that the shadow mask can be used for several coatings, and wherein the coating system is a drum system, in which the substrates to be coated are guided past a coating source with a target surface, wherein the axis of rotation of the drum is arranged parallel to a straight line lying in the target surface and the substrates are mounted on the drum shell in such a way that the plane of the substrates spanned by the substrate surface does not intersect the axis of rotation of the drum.

10. The method according to claim 9, wherein the coating source is sputtering target.

11. The method according to claim 7, wherein the coating source is sputtering target.

12. The method according to claim 8, wherein the coating source is sputtering target.

* * * * *